United States Patent
Gao et al.

(10) Patent No.: US 8,243,503 B2
(45) Date of Patent: Aug. 14, 2012

(54) MAGNETIC STORAGE ELEMENT RESPONSIVE TO SPIN POLARIZED CURRENT

(75) Inventors: Kaizhong Gao, Eden Prairie, MN (US); Haiwen Xi, San Jose, CA (US); Yiming Shi, Maple Grove, MN (US); Song S. Xue, Edina, MN (US); Sining Mao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/958,106

(22) Filed: Dec. 1, 2010

(65) Prior Publication Data

US 2011/0069537 A1    Mar. 24, 2011

Related U.S. Application Data

(63) Continuation of application No. 11/724,740, filed on Mar. 16, 2007, now Pat. No. 7,859,069.

(51) Int. Cl.
*G11C 11/00* (2006.01)
(52) U.S. Cl. .................. 365/158; 365/171; 365/173
(58) Field of Classification Search .............. 365/158, 365/171, 173
See application file for complete search history.

(56) References Cited

U.S. PATENT DOCUMENTS

| | | | |
|---|---|---|---|
| 5,982,660 A | 11/1999 | Bhattacharyya et al. | |
| 6,130,814 A | 10/2000 | Sun | |
| 6,532,164 B2 | 3/2003 | Redon et al. | |
| 6,888,742 B1 | 5/2005 | Nguyen et al. | |
| 6,980,469 B2 | 12/2005 | Kent et al. | |
| 6,982,909 B2 | 1/2006 | Perner et al. | |
| 7,005,691 B2 | 2/2006 | Odagawa et al. | |
| 7,006,375 B2 | 2/2006 | Covington | |
| 2001/0026471 A1 | 10/2001 | Michijima et al. | |
| 2002/0122338 A1 | 9/2002 | Park et al. | |
| 2002/0154536 A1* | 10/2002 | Perner ........................ | 365/158 |
| 2004/0027853 A1 | 2/2004 | Huai et al. | |
| 2004/0246776 A1 | 12/2004 | Covington | |
| 2006/0250840 A1* | 11/2006 | Zheng et al. ................ | 365/171 |
| 2007/0063237 A1 | 3/2007 | Huai et al. | |
| 2007/0086120 A1 | 4/2007 | Shimazawa et al. | |

* cited by examiner

*Primary Examiner* — Jason Lappas
(74) *Attorney, Agent, or Firm* — Hall Estill Attorneys at Law

(57) ABSTRACT

The present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

22 Claims, 3 Drawing Sheets

MAGNETIC STORAGE ELEMENT RESPONSIVE TO SPIN POLARIZED CURRENT

BACKGROUND

The present invention relates to magnetic storage devices. More particularly, the present invention relates to magnetic random access memory responsive to spin polarized current.

In magnetic random access memory (MRAM), bits are represented by the magnetic configuration of a small volume of ferromagnetic material, and its magnetic state is measured via a magnetoresistive (MR) effect during read-back. The MRAM typically includes a two-dimensional array of cells, with each cell containing one MR element that can store one bit.

Most common MRAM designs employ MR elements that are based on either giant magnetoresistance (GMR) or tunneling magnetoresistance (TMR), where these elements are patterned thin film multilayer structures that include at least one pinned layer and one free layer. These elements are designed so that the free layer has a bistable magnetic configuration that is preferentially aligned along one of two possible anti-parallel directions. Hence, the binary data stored is related to the orientation of the free layer magnetization. The pinned layer magnetization is aligned along only one of the two possible free layer directions, and its role is to provide a fixed reference so that the magnetoresistance reveals the free layer orientation with respect to the pinned layer.

There are numerous ways to implement a device based on this concept. However, the leading method to write bits is a so-called "half-select" process in which the magnetic fields generated by two roughly orthogonal current carrying wires orient the free layer into its intended configuration. The amplitudes of the currents flowing through the two wires, referred to as the word and bit lines, are chosen so that the corresponding fields reverse a free layer only where the two wires intersect. Therefore, this method can select any individual cell within the array with a minimum of electrical wires and without unintentionally reversing the magnetic state of other cells. However, this writing scheme exhibits poor scaling with increasing areal density of cells.

SUMMARY

The present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

DETAILED DESCRIPTION

Figure 1:
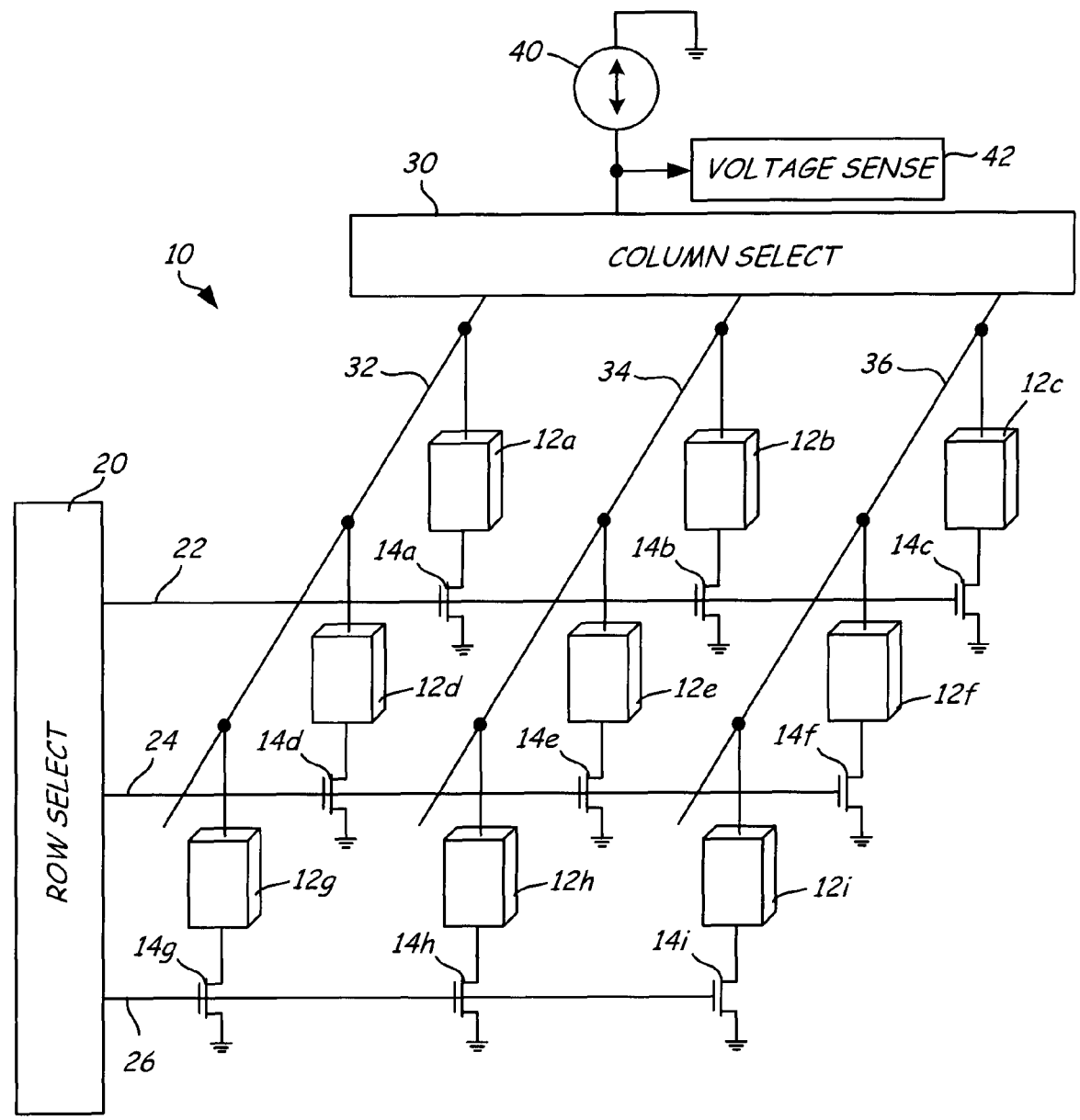
FIG. 1 is a schematic view of an array of memory cells in a magnetic memory system.

FIG. 1 is a schematic view of magnetic random access memory (MRAM) 10 including memory cells 12a, 12b, 12c, 12d, 12e, 12f, 12g, 12h, and 12i (collectively referred to as memory cells 12). A 3×3 array of memory cells 12 is shown for ease of illustration, but it will be appreciated that the array shown is a subset of a typical number of memory cells 12 in an MRAM device. MRAM 10 also includes transistors 14a, 14b, 14c, 14d, 14e, 14f, 14g, 14h, and 14i (collectively referred to as transistors 14), row select module 20, row select lines 22, 24, and 26, column select module 30, column select lines 32, 34, and 36, read/write current source 40, and voltage sensor 42.

Each transistor 14a-14i is connected between respective memory cell 12a-12i and ground. The gates of transistors 14a, 14b, and 14c are connected to row select line 22, the gates of transistors 14d, 14e, and 14f are connected to row select line 24, and the gates of transistors 14g, 14h, and 14i are connected to row select line 26. Memory cells 12a, 12d, and 12g are connected to column select line 32, memory cells 12b, 12e, and 12h are connected to column select line 34, and memory cells 12c, 12f, and 12i are connected to column select line 36. Current source 40 is selectably connected to column select lines 32, 34, and 36 via column select module 30. Voltage sensor 42 is connected to sense the voltage at column select module 30.

Memory cells 12a-12i each includes a magnetoresistive element that has a magnetization state corresponding to data written to the cell. To write data to a memory cell 12, the row and column select lines that intersect at the memory cell 12 to which data is to be written are activated by applying a voltage. For example, to write data to memory cell 12f, voltages are applied to row select line 24 by row select module 20 and to column select line 36 by column select module 30. By activating the row select line 24 and column select line 36 associated with the memory cell 12f, a current loop is provided through current source 40, memory cell 12f and transistor 14f. Current source 40 provides current perpendicular to the major plane of the layers of memory cell 12f. The magnetization state of memory cell 12f is a function of the direction of the current from current source 40 through memory cell 12f. More specifically, a first magnetization state is written to memory cell 12f when current is provided through memory cell 12f in a first direction, and a second magnetization state is written to memory cell 12f when current is provided through memory cell 12f in a second direction opposite the first direction.

In order to read data from a memory cell 12, the row and column select lines that intersect at the memory cell 12 from which data is to be read are activated by applying a voltage. For example, to read data from memory cell 12g, voltages are applied to row select line 26 by row select module 20 and to column select line 32 by column select module 30. Current source 40 then provides current through memory cell 12g, and the voltage across memory cell 12g is measured by voltage sensor 42. Voltage sensor 42 senses changes in the voltage due to resistance changes across memory cell 12g induced by the applied current. Based on the voltage response of memory cell 12g to the applied current, the magnetization state of memory cell 12g may be determined.

Figure 2:
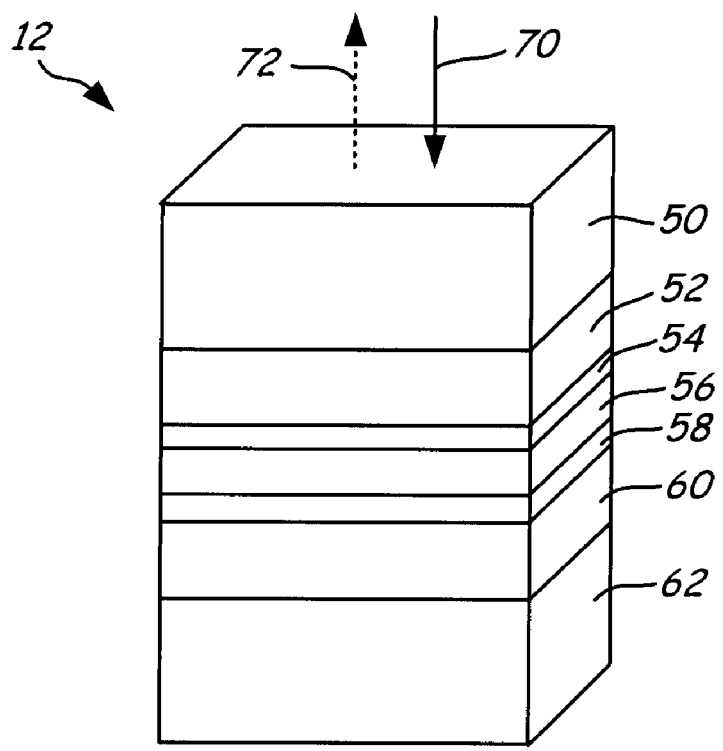
FIG. 2 is a perspective view of a memory cell including a free layer positioned between two reference layers.

FIG. 2 is a perspective view of memory cell 12 including first biasing or pinning layer 50, first reference or pinned layer 52, first spacer layer 54, storage or free layer 56, second spacer layer 58, second reference or pinned layer 60, and second biasing or pinning layer 62. First biasing layer 50 and second biasing layer 62 may be comprised of an antiferromagnetic material, such as Ru, PtMn, IrMn, NiMn, FeMn, RhMn, and RuRhMn. First reference layer 52, storage layer 56, and second reference layer 60 may be comprised of a ferromagnetic material, such as CoFe, NiFe or NiFeCo. First spacer layer 54 and second spacer layer 58 may be comprised of a nonmagnetic conductive material, such as Au, Ag, NiFeCr, Al, and Ru, such that memory cell 12 provides a giant magnetoresistive (GMR) response. First spacer layer 54 and second spacer layer 58 may alternatively be comprised of an insulating material, such as a metal oxide including $Al_2O_3$, $MgO$, $HfO_2$, $Y_2O_3$, $TiO_2$ or $ZrO_2$, such that memory cell 12 provides a tunneling magnetoresistive (TMR) response.

First biasing layer 50 sets or pins the magnetization of first reference layer 52 in a first magnetization direction, and second biasing layer 62 sets or pins the magnetization of second reference layer 60 in a second magnetization direction. In some embodiments, the first magnetization direction is substantially perpendicular to the second magnetization direction. In an alternative embodiment, first biasing layer 50 and second biasing layer 62 may be eliminated and the magnetizations of first reference layer 52 and second reference layer 60 may be pinned due to the shape anisotropy of these layers.

As described above, when writing to memory cell 12, the magnetization direction of storage layer 56 is a function of the direction of current from current source 40 applied to memory cell 12. When current from current source 40 is directed through memory cell 12 in a first direction (shown as current direction 70 in FIG. 2), the magnetization of storage layer 56 is set in a first direction corresponding to a first data state. When current from current source 40 is directed through memory cell 12 in a second direction opposite the current direction 70 (shown as current direction 72 in FIG. 2), the magnetization of storage layer 56 is set in a second direction corresponding to a second data state. The magnetization direction of storage layer 56 is responsive to the applied current due to the spin transfer effect, in which the applied current transfers spin angular momentum from an adjacent reference layer to storage layer 56, which causes the magnetization of storage layer 56 to rotate. The strength of the torque on the magnetization of storage layer 56 is directly proportional to the current density through memory cell 12. Therefore, for a given current, the current density will increase as the area of memory cell 12 decreases in size, and spin transfer will become more efficient as the density of MRAM 10 increases.

Figure 3:
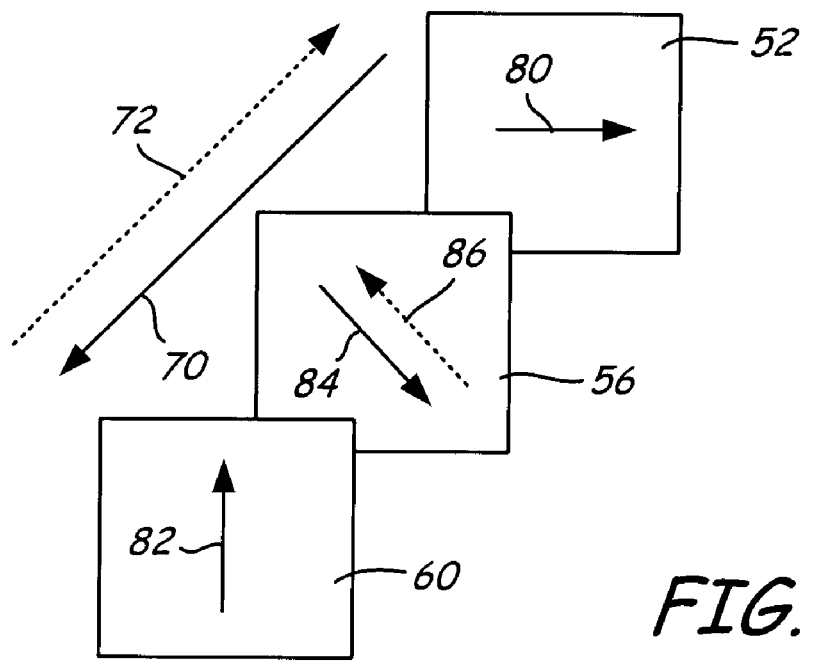
FIG. 3 is an exploded plan view of the free layer and the two reference layers showing their relative magnetization states as a function of an applied current.

To illustrate, FIG. 3 is an exploded plan view of first reference layer 52, storage layer 56, and second reference layer 60 showing the relative magnetization directions of these layers. In the embodiment shown, first reference layer 52 has a magnetization direction 80, and second reference layer 60 has a magnetization direction 82 substantially perpendicular to magnetization direction 80. When current from current source 40 is directed through memory cell 12 in current direction 70, the current is spin polarized by first reference layer 52, and spin angular momentum from the spin polarized current is transferred to storage layer 56. This causes the magnetization of storage layer 56 to orient in magnetization direction 84. In the embodiment shown, magnetization direction 84 is about 45° from magnetization direction 80 and about 135° from magnetization direction 82. When the magnetization of storage layer 56 is arranged in this way, memory cell 12 stores a first data state (i.e., a "0" bit).

When current from current source 40 is directed through memory cell 12 in current direction 72, the current is spin polarized by second reference layer 60, and spin angular momentum from the spin polarized current is transferred to storage layer 56. This causes the magnetization of storage layer 56 to orient in magnetization direction 86, which is opposite or antiparallel to magnetization direction 84. In the embodiment shown, magnetization direction 86 is about 135° from magnetization direction 80 and about 45° from magnetization direction 82. When the magnetization of storage layer 56 is arranged in this way, memory cell 12 stores a second data state (i.e., a "1" bit).

Figure 4A:
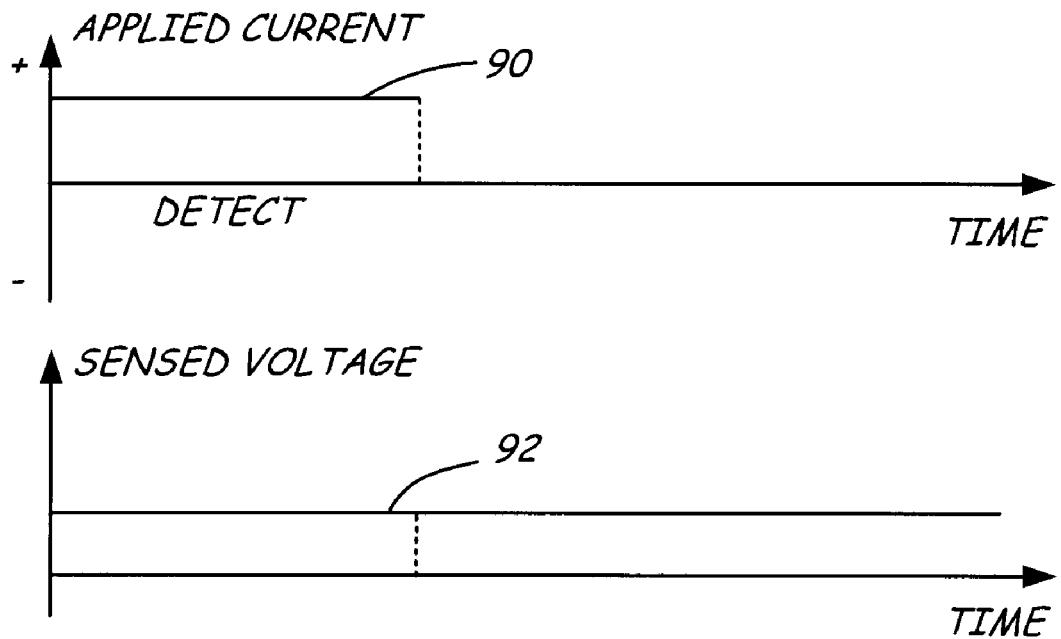
FIG. 4A is a graph showing the response of the memory cell in a first data state to an applied current.

In order to read data from memory cell 12, current from current source 40 is applied in current direction 70 through memory cell 12, and the voltage across memory cell 12 is measured by voltage sensor 42. FIG. 4A is a graph showing the response of memory cell 12 to the applied current when memory cell 12 is in the first data state. As described above, a current applied in current direction 70 writes data in memory cell 12 to the first data state. Thus, when the current is applied in current direction 70 (line 90), the voltage sensed across memory cell 12 remains substantially constant during a detect period (line 92) since the magnetization state of storage layer 56 is unchanged by the applied current. The constant voltage measured by voltage sensor 42 is detected to read the first data state from memory cell 12.

Figure 4B:
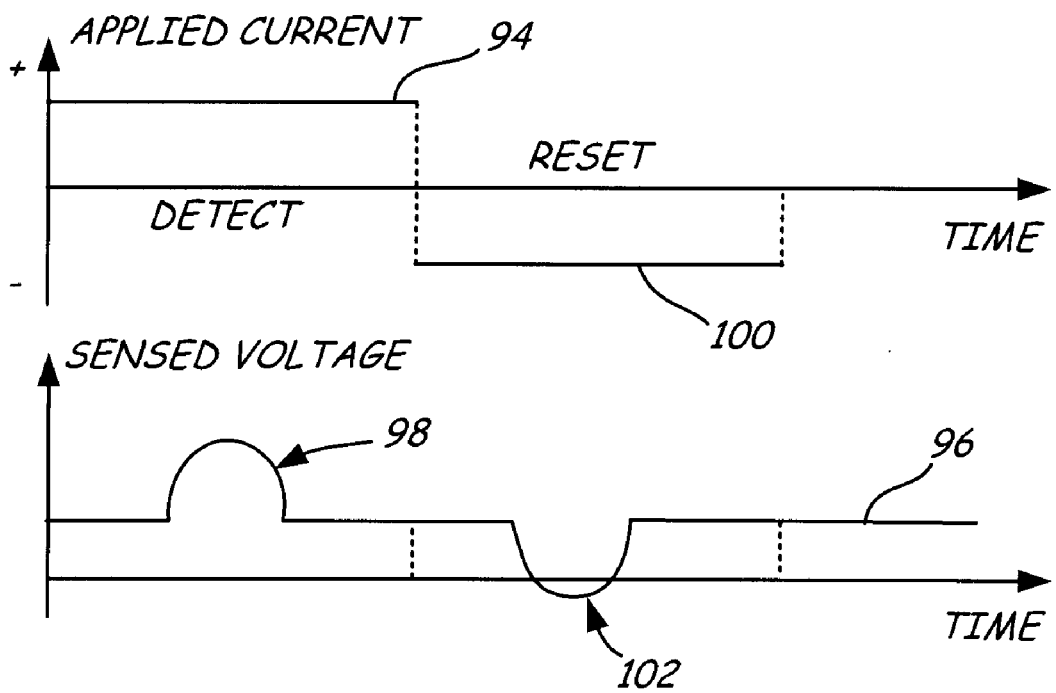
FIG. 4B is a graph showing the response of the memory cell in a second data state to an applied current.

FIG. 4B is a graph showing the voltage response of memory cell 12 when current from current source 40 is applied in current direction 70 when memory cell 12 is in the second data state. Again, a current applied in current direction 70 writes data in memory cell 12 to the first data state. Thus, when current is applied in current direction 70 (line 94), the voltage sensed across memory cell (line 96) changes as the magnetization of storage layer 56 rotates from magnetization direction 84 to magnetization direction 86 during the detect period. This change in sensed voltage, illustrated as pulse 98 in FIG. 4B, is detected to read the second data state from memory cell 12.

In response to the change in magnetization direction in storage layer 56 induced by the applied current, memory cell 12 is reset to its data state immediately prior to the read process by applying a current to memory cell 12 in current direction 72. To assure that memory cell 12 is accurately re-written to its correct state, voltage sensor 42 may sense the voltage across memory cell 12. When current is applied in current direction 72 during a reset period (line 100), the voltage sensed across memory cell 12 again changes as the magnetization of storage layer 56 rotates back from magnetization direction 86 to magnetization direction 84. This change in sensed voltage, illustrated as pulse 102 in FIG. 4B, is detected to verify that the second data state is re-written to memory cell 12.

Memory cell 12 allows information to be written to and read from memory cell 12 using the same applied current. Also, the applied current necessary to induce switching of data states during the write process is significantly reduced over existing designs, and the amplitude of the voltage pulse during the read process is significantly increased for improved detectability. In addition, manufacturing of memory cell 12 is simple, since the magnetizations of reference layers 52 and 60 may be set by rotating the wafer after fabrication of reference layer 60 such that the reference layer 52 is later fabricated with a magnetization substantially perpendicular to that of reference layer 60. Furthermore, intercell interference in a magnetic memory system including a plurality of memory cells 12 is substantially eliminated.

In summary, the present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

Although the present invention has been described with reference to preferred embodiments, workers skilled in the art will recognize that changes may be made in form and detail without departing from the spirit and scope of the invention.

The invention claimed is:

1. A method comprising:
    programming a memory cell to a first data storage state by applying a first spin torque current through the cell; and determining the cell was programmed to the first data storage state by said first spin torque current by subsequently applying a second spin torque current through the cell which programs the cell to a different, second data storage state while simultaneously monitoring a voltage drop across the cell during application of the second spin torque current, followed by subsequently applying a third spin torque current through the memory cell to reprogram the memory cell back to the first data storage state, the first, second and third spin torque currents establishing selected magnetization orientations of a free layer of the memory cell.

2. The method of claim 1, in which the memory cell is characterized as a magnetic random access memory (MRAM) cell.

3. The method of claim 1, in which the first spin torque current is applied in a first direction through the cell, and the second spin torque current is applied in a second direction through the cell opposite the first direction.

4. The method of claim 2, in which the first spin torque current is nominally equal in magnitude to the second spin torque current.

5. The method of claim 1, in which the determining step comprises sensing a voltage drop across the memory cell during said application of the second spin torque current.

6. The method of claim 1, in which the cell is determined to have been programmed to the first data storage state by using a voltage sensor to monitor the voltage drop across the cell as the second spin torque current flows through the cell, the voltage sensor detecting a pulse in said monitored voltage drop indicative of a changing magnetization orientation of the free layer induced by said second spin torque current flow.

7. The method of claim 1, in which the cell comprises first and second reference layers with respective pinned magnetization orientations in orthogonal directions, and an intervening free layer between said first and second reference layers, the spin torque current of the programming step establishing a magnetization orientation of the free layer in a selected direction non-orthogonal to the magnetization orientations of the first and second reference layers.

8. The method of claim 4, in which the selected direction of the magnetization orientation of the free layer established during the programming step is a first magnetization direction, and the application of the spin torque current in the opposing, second direction during the determining step establishes the magnetization orientation of the free layer in a second direction opposite the first direction.

9. The method of claim 1, in which the memory cell comprises a switching device coupled to a semiconductor stack of magnetically responsive layers.

10. A method comprising:
    writing a data state to a memory cell by application of a first spin torque current to place a free layer of said memory cell in a first magnetic orientation; and
    subsequently reading the written data state of the memory cell by applying a second spin torque current to the memory cell that switches the free layer to a second magnetic orientation opposite the first magnetic orientation while monitoring a voltage drop across the memory cell during application of the second spin torque current to detect said switching responsive to a pulse in the monitored voltage drop, followed by application of a third spin torque current to return the free layer to the first magnetic orientation.

11. The method of claim 10, in which the memory cell comprises a first pinned reference layer having a fixed magnetization in a first direction, a second pinned reference layer having a fixed magnetization in a second direction orthogonal to the first direction, and the first magnetic direction of the free layer established during the writing step is non-orthogonal to the first and second directions.

12. The method of claim 10, in which the first and third spin torque currents are applied in a first direction through the cell, and the second spin torque current is applied in a second direction through the cell opposite the first direction.

13. The method of claim 10, in which the first, second and third spin torque currents are all nominally equal in magnitude.

14. The method of claim 10, in which the written data state of the memory cell is read during the reading step by by using a voltage sensor to continuously monitor the voltage drop across the memory cell as the second spin torque current flows through the memory cell and to detect a pulse in said voltage drop indicative of a changing magnetic orientation of a free layer of the cell induced by said flow.

15. The method of claim 10, in which the first magnetic orientation is orthogonal to the second magnetic orientation.

16. The method of claim 10, in which the memory cell comprises a switching device coupled to a semiconductor stack of magnetically responsive layers. the switching device placed into a conductive state during application of the respective first, second and third spin torque currents.

17. A portable data storage device, comprising a memory array and a controller adapted to direct a write operation upon a selected memory cell of the memory array by application of a first spin torque current to place a free layer of said memory cell in a first magnetic orientation, and to direct a subsequent read operation upon the selected memory cell by applying a second spin torque current to the memory cell that transitions the free layer to a second magnetic orientation opposite the first magnetic orientation while using a voltage sensor to monitor a voltage drop across the memory cell and detect said transition in real time responsive to a detected pulse in said voltage drop. followed by application of a third spin torque current to return the free layer to the first magnetic orientation.

18. The data storage device of claim 17, in which the selected memory cell comprises a first pinned reference layer having a fixed magnetization in a first direction, a second pinned reference layer having a fixed magnetization in a second direction orthogonal to the first direction, and the first magnetic direction of the free layer established during the write operation is non-orthogonal to the first and second directions.

19. The data storage device of claim 17, further comprising a spin torque current generator which generates the first, second and third spin torque currents of nominally equal magnitude.

20. The data storage device of claim 17, further comprising a sense circuit which senses a written data state of the memory cell established by the first spin torque current by sensing a change in magnitude of a voltage drop across the memory cell during continuous application of the second spin torque current.

21. A method comprising applying a first spin torque current to a memory cell to program the cell to a first state, followed by simultaneously monitoring a voltage drop across the cell during application of a second spin torque current to the memory cell that is used to program the cell to a different, second state, followed by applying a third spin torque current to the memory cell to return the cell to the first state, wherein the first state is determined responsive to a pulse detected in the monitored voltage drop.

22. The method of claim 21, in which the voltage drop is simultaneously monitored using a voltage sensor coupled to the memory cell which detects a change in magnetic orientation of a free layer of the memory cell in real time during the application of the second spin torque current.

* * * * *